United States Patent [19]
Akiyama et al.

[11] Patent Number: 4,713,277
[45] Date of Patent: Dec. 15, 1987

[54] FOAMED METAL AND METHOD OF PRODUCING SAME

[75] Inventors: Shigeru Akiyama; Hidetoshi Ueno; Koji Imagawa; Akira Kitahara; Sumio Nagata, all of Tosu; Kazuo Morimoto, Amagasaki; Tooru Nishikawa, Amagasaki; Masao Itoh, Amagasaki, all of Japan

[73] Assignees: Agency of Industrial Science and Technology, Tokyo; Shinko Kosen Kogyo Kabushiki Kaisha, Amagasaki, both of Japan

[21] Appl. No.: 886,678

[22] Filed: Jul. 18, 1986

[30] Foreign Application Priority Data

Jul. 19, 1985 [JP] Japan .............................. 60-160804
Dec. 25, 1985 [JP] Japan .............................. 60-297832
Jan. 27, 1986 [JP] Japan .............................. 61-9972[U]

[51] Int. Cl.⁴ .......................... E04B 1/82; B32B 3/10; B32B 3/24; B32B 15/00
[52] U.S. Cl. ................................... 428/131; 75/20 R; 75/20 F; 181/168; 181/294; 428/613; 428/688
[58] Field of Search ............... 428/307.3, 309.9, 318.6, 428/613, 131, 134, 135, 136, 688; 181/168, 294; 164/79; 75/20 F, 20 R

[56] References Cited

U.S. PATENT DOCUMENTS

| | | | |
|---|---|---|---|
| 2,751,289 | 6/1956 | Elliott | 75/20 F |
| 2,983,597 | 5/1961 | Elliott | 75/20 F |
| 3,300,296 | 1/1967 | Hardy et al. | 75/20 R |
| 3,617,364 | 11/1971 | Jarema et al. | 428/307.3 |
| 3,708,380 | 1/1973 | Niebylski | 428/318.6 |
| 3,711,363 | 1/1973 | Jarema et al. | 428/318.6 |
| 3,816,952 | 6/1974 | Niebyski et al. | 75/20 F |
| 3,839,080 | 10/1974 | Jarema et al. | 428/307.3 |

FOREIGN PATENT DOCUMENTS

| | | | |
|---|---|---|---|
| 49259 | 4/1980 | Japan | 428/312.8 |
| 2102808 | 2/1983 | United Kingdom | 428/314.8 |

*Primary Examiner*—William J. Balen
*Attorney, Agent, or Firm*—Oblon, Fisher, Spivak, McClelland, & Maier

[57] ABSTRACT

A foamed metal which has an apparent specific gravity of from 0.2 to 0.8 and comprises an aggregate of polygonal closed cells of from 2 to 10 mm in average diameter. The foamed metal is not only light in weight, free of directionality and structurally strong but also excellent in sound-absorbing and electromagnetic shielding properties, and is useful as constructional, structural or functional material. A method for producing the foamed material comprises adding calcium as a thickening agent to molten aluminum or alloy thereof in an amount of from 0.2 to 8% by weight, followed by agitating to adjust the viscosity of the melet, then adding from 1 to 3% by weight of powdered titanium hydride as a foaming agent to the melt, and agitating the melt to effect foaming.

3 Claims, 30 Drawing Figures

REFERENCE PHOTOGRAPH

FOAMED METAL AND METHOD OF PRODUCING SAME

BACKGROUND OF THE INVENTION (1) Field of the Invention

This invention relates to extremely lightweight foamed metals, particularly aluminum and alloys thereof, comprising a multiplicity of cells, and to a method of producing the foamed metal in which the multiplicity of cells are uniform in size. This invention relates also to a sound absorbing material having excellent sound absorption characteristics over a wide acoustic frequency range from low to high frequency and an electromagnetic shielding material having excellent shielding characteristics, which are based on the foamed metal.

The foamed metal has a thin film aggregate structure of a plurality of uniformly dispersed cells having an average diameter of from 2 to 10 mm, has an extremely light weight as represented by an apparent specific gravity of from 0.2 to 0.8, and has excellent sound absorbing and electromagnetic shielding properties. Accordingly, the foamed metal is extremely useful as constructional material, structural material and functional material haivng many funcitons.

(2) Description of the Prior Art

Hitherto, a variety of studies and inventions have been made concerning means for producing foamed metals, but there has not been practiced a method for economically producing an extremely lightweight foamed metal consisting of a uniform aggregate of cells, because of much difficulties involved. In order to produce a foamed metal, it has been attempted to use a foaming agent such as hydrous inorganic compounds and metal hydrides which decomposes at a temperature slightly higher than the melting point of a metal to be foamed, e.g., aluminum or an alloy thereof, and as a means for raising the viscosity of a molten metal, it has been attempted to blow air or the like into the molten metal or use an oxygen-containing chemical as a thickener. However, a satisfactory foamed metal has not yet been obtained by such means.

Basically, it is important to appropriately select a combination of the kind and amount of the thickener for quickly producing the molten metal with a proper viscosity and the kind and amount of the foaming agent for appropriate formation of foam. In addition, in the process of solidification of the molten foamed metal by cooling it is necessary to reduce the loss of gas generated through decomposition of the foaming agent, and in order to prevent differences between the bubbles in the inside part of the foamed metal and those at peripheral part of the foamed metal as well as prevent formation of cavities at the time of solidifications it is necessary to appropriately control the pressure inside the mold.

In addition, the recent development of electronic apparatuses has brought about a serious problem of electromagnetic wave interference. To cope with the wave interference, it has been attempted to thermally spray zinc or apply a conductive coating material to plastic casting of the electronic apparatus or to mix a conductive filler into the plastics. However, satisfactory results have not been obtained by such means.

Besides, though there have been used wood, synthetic resins, plywood, etc. as constructional material for walls, desks, cupboards and the like, all of these materials have both merits and demerits in view of flame retardancy, weight, strength, cost, etc. Constructional plates are, in many cases, desired to be light in weight, excellent in flame retardancy and capable of being produced at low cost.

SUMMARY OF THE INVENTION

This invention contemplates to solve the abovementioned problems.

An object of this invention is to provide a foamed metal having a thin film aggregate structure of uniformly dispersed polygonal cells of from 2 to 10 mm in average diameter and having an apparent specific gravity of from 0.2 to 0.8. The foamed metal is not only light in weight, free of directionality and structurally strong but also excellent in sound-absorbing and electromagnetic shielding properties, and, accordingly, is extremely useful as constructional, structural or functional material having many functions.

In another aspect of this invention, there is provided a method of producing the above-mentioned foamed metal, in which metallic calcium is added to a molten metal in an amount of from 0.2 to 8% by weight to adjust the viscosity of the melt, and titanium hydride is added in an amount of from 1 to 3% by weight to foam the molten metal. On the mold is fitted a lid with appropriate weight which has an air release hole for releasing the gas generated in the mold as the molten metal expands due to foaming, thereby preventing release of gas contained in the bubbles of the foamed metal and maintaining balanced gas pressure in the bubbles, to form a homogeneous cellular structure. In place of the lid for the mold, a flat plate with appropriate weight may be used. The plate is floated on the molten metal in direct contact with the surface of the molten metal so that the plate is pushed upward by the internal gas pressure of bubbles while being balanced with the gas pressure, thereby maintaining the size of the bubbles to be uniform.

In a further aspect of this invention, the foamed metal is cut to expose rugged surfaces of the foam, or is further provided with through-holes in the foam walls so as to communicate the closed cells, whereby the foamed metal is provided with excellent sound-absorbing effect over a wide frequency range from low to high frequency. Besides, the sound-absorbing material is extremely effective in coping with the low frequency pollution which has recently come to be a social problem.

Furthermore, the foamed metal according to this invention has good electromagnetic shielding characteristics as well as good thermal and mechanical properties. Therefore, the foamed metal is useful as an electromagnetic shielding material having the function of constructional or other structural material, such as housing of electronic apparatus and electromagnetically shielded room. The electromagnetic shielding material of this invention is a foamed metal plate comprising an aggregate of closed cells, which has no through-hole communicating both sides of the plate to each other, or has such through holes not larger than 5 mm in diameter.

In a still further aspect, the invention provides a composite plate extremely light in weight and having good flame retardancy and strength, by utilizing the foamed metal. The composite plate comprises a synthetic resin layer laminated on at least one side of a plate form body of the foamed metal, the layer eating into rugged parts of the foamed metal. In this structure, the main body consists of the foamed metal, so that an extremely lightweight plate having good flame retardancy and a certain extent of strength can be produced at low cost.

DETAILED DESCRIPTION OF THE INVENTION

The following examples are used to illustrate this invention.

EXAMPLE 1

Aluminum was melted at 720° C., and 1.6% by weight of calcium was added to molten aluminum and stirred to increase the viscosity of the melt. Though the viscosity adjustment can be achieved also by an air blowing method instead of addition of the thickener, in such a method it is necessary to stir the melt for a very long time in order to retain the thermallly decomposed gas of a foaming agent in the melt and to thereby provide the melt with a viscosity sufficient to maintain closed foam. On the other hand, when calcium, which has high affinity for oxygen, is added to the melt as a thickener and the melt is stirred, it is possible to thicken the melt in a very short time. In this case, addition of less than 0.2% by weight of calcium leads to the need to stir for a long time, which is extremely disadvantageous from the viewpoints of efficiency and economy. The purpose of thickening the melt can be sufficiently accomplished by the addition of up to 8% by weight of calcium.

Beside, when 1.6% by weight of powdered titanium hydride as a foaming agent is added to the melt maintained at 720° C. after viscosity adjustment and the melt is stirred, a homogeneous foamed material with a porosity of about 90% can be obtained. If the amount of titanium hydride is less than 1% by weight, sufficient foaming does not take place. If the amount is more than 3% by weight, excessive foaming occurs, and a long time is required for stirring, or the film structure of foam is broken or a uniform film structure cannot be easily obtained. Therefore, an appropriate amount of titanium hydride to be added is from 1 to 3% by weight.

The present invention resides in a method of producing a foamed metal, which comprises adding calcium as a thickening agent to molten aluminum or alloy thereto in an amount of from 0.2 to 8% by weight, followed by stirring to adjust the viscosity of the melt, then adding from 1 to 3% by weight of powdered titanium hydride as a foaming agent to the melt, and stirring the melt to effect foaming. By this method, it is possible to produce a foamed metal having a cellular structure consisting of cells of uniform size and shape, and to produce the foamed metal on an industrial scale.

EXAMPLE II

The reference photograph shows a cut surface of foamed aluminum produced according to this invention.

According to the invention, the method of producing a foamed metal comprising a multiplicity of closed cells comprises adding a foaming agent and a thickener to a molten metal and agitating the melt, wherein the entire body of a mold is heated to or above the melting point of a foamed metal, calcium as the thickening agent is added to molten aluminum or alloy thereof in an amount of from 0.2 to 8% by weight, followed by agitating the melt to adjust the viscosity of the melt, then powdered titanium hydride is added to the melt in an amount of from 1 to 3% by weight, followed by agitating the melt to effect foaming, and in the process of growth of the foam the mold is closed in the condition in which an air release port is provided, air inside the mold is released to the exterior by expansion of a multiplicity of bubbles generated on thermal decomposition of the foaming agent, the molten metal is permitted to fill up the interior of the mold to close the release port thereby hermetically sealing the mold, the internal pressure of the bubbles in the hermetically sealed mold is increased to form a uniform cellular structure under the balanced internal pressures of the bubbles, then heating of the mold is stopped to cool and solidify the foamed metal.

In FIG. 1, a mold 1 is charged with molten aluminum 2 to which a foaming agent is added, and molten aluminum 2 is stirred by a stirrer 3. The mold 1 is heated by a heater 4 disposed around the mold 1. As shown in FIG. 1(B), decomposition of the foaming agent causes molten aluminum 2 to expand to be foamed aluminum 20, and the internal gas pressure ($P_2$) is raised, so that the pressure $P_2$ overcomes the total sum $P_1$ of the atmospheric pressure and the viscous drag of molten aluminum thus leading to expansion of a multiplicity of bubbles. Since the mold 1 is opened to the atmosphere on one side thereof and a free surface is formed, each of the bubbles is expanded arbitrarily by the internal gas pressure thereof, resulting in an aggregate of cells which are extremely non-uniform in size and shape.

Figures 2, 3, 4, 5:
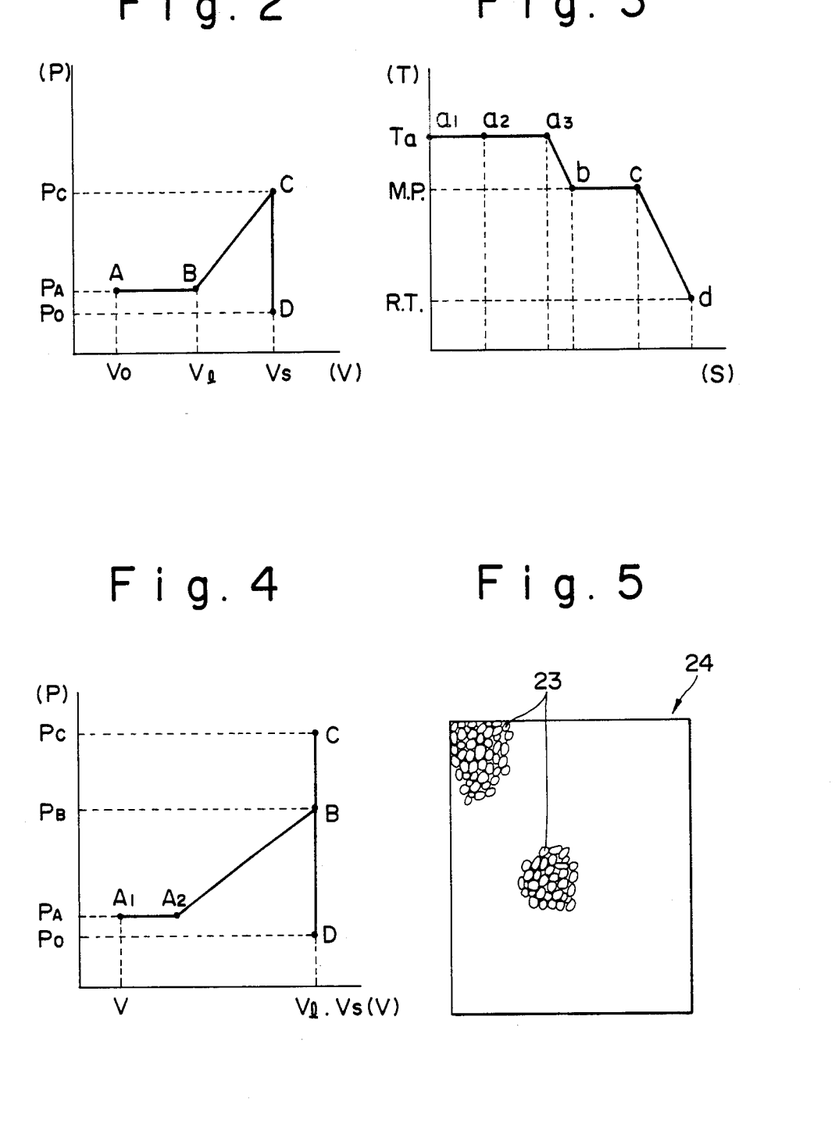
FIG. 2 shows diagramatically the relationship between the gas pressure and the volume of foamed aluminum in a conventional method.
FIG. 3 shows diagramatically the relationship of aluminum temperature T, time S and operation at each stage.
FIG. 4 shows diagramatically the relationship between the gas pressure and the volume of foamed aluminum in the method according to this invention.
FIG. 5 shows schematic illustration of a homogeneous foamed aluminum obtained according to this invention.

FIG. 2 shows a diagram of the relationship between the gas pressure and the volume of foamed aluminum. In the figure, the volume $V_0$ of molten aluminum at the time point A when stirring is started with addition of a foaming agent is increased to a volume $V_1$ at point B while substantially maintaining the gas pressure $P_A$, during the addition of the foaming agent. In this case, since the time of addition of the foaming agent varies, the amount of gas already generated also varies, so that the cells thus formed differ in volume. The volume of foamed aluminum 20 gradually increases from a value $V_1$ at the time of completion of the addition of the foaming agent (point B) to a value $V_S$ at point C of completion of solidification, accompanied by an increase of the gas pressure.

Figure 1A:
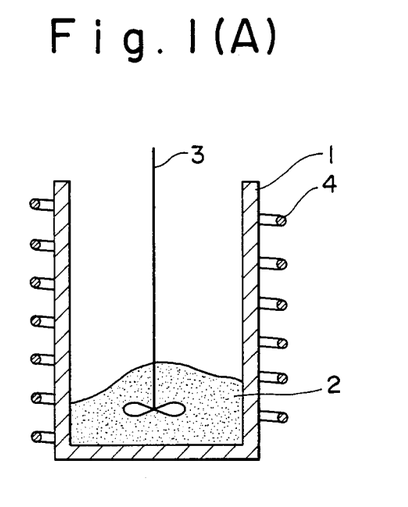
FIGS. 1(A) to 1(D) illustrate schematically the method of producing foamed metal according to this invention.
Figure 1B:
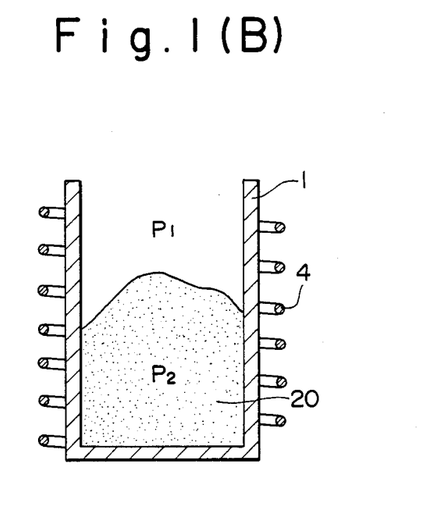
Figure 7:
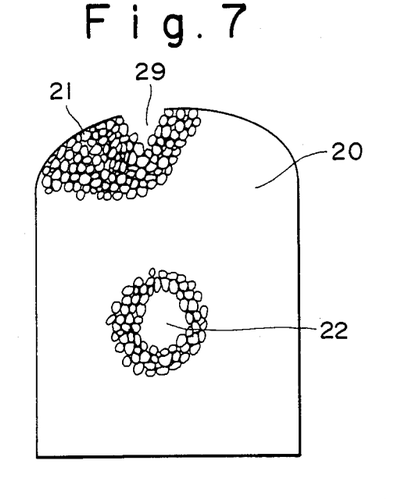
FIG. 7 illustrates craters formed at the free surface part of a foamed metal which is foamed in the condition shown in FIG. 1(B)

When foaming is continued in the state shown in FIG. 1(B) according to a conventional method, foamed aluminum 20 thus formed is solidified earliest at its free surface in contact with the outside air, and the solidified surface is broken by the gas pressure to form craters 29 as shown in FIG. 7. In addition, the cells 21 in the foamed aluminum 20 differ in size, with larger cells 22 formed at and near a central part which solidifies last. When foamed aluminum 20 is solidified and cooled to normal temperature, the gas contained in each cell is also cooled, so that the internal pressure is lowered as indicated at point D in FIG. 2.

FIG. 3 shows diagramatically the relationship of aluminum temperature T, time S and operation at each stage. In the figure, point $a_1$ is the time point of mixing the foaming agent and starting stirring at a temperature Ta higher than the melting point (M.P.) of aluminum, point $a_2$ is the time point when stirring is finished, and point $a_3$ is the time point when heating of the mold 1 is stopped, molten aluminum being foamed while maintaining it above the melting point thereof in the period from point $a_1$ to point $a_3$. Point b is the time point when foamed aluminum reaches the melting point thereof, then the solidification is finished at point c, and foamed aluminum reaches normal temperature (R.T.), whereon it is taken out of the mold 1.

Figure 1C:
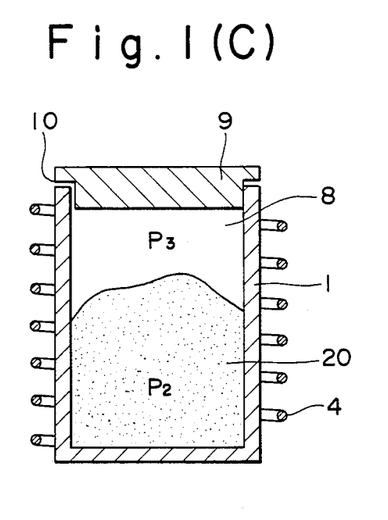

A basic operation in the method according to the present invention is to close the mold 1 at point $a_2$ in FIG. 3, that is, at the time when stirring after addition of the foaming agent is completed. Namely, as shown in FIG. 1(C), a lid 9 preheated to the foaming temperature Ta is fitted to the mold 1, thereby closing the mold 1 in the condition in which an air release port 10 is formed. A plurality of air release ports 10 may be formed at appropriate positions. Preheating of the lid 9 is performed because if the lid temperature is low the expanding free surface of aluminum being foamed is lowered to below the melting point of aluminum, which prevents sufficient foaming. In addition, the relation between the size of the mold 1 and the amount of molten aluminum 2 placed therein is so set that the finished product has a predetermined expansion ratio.

Figure 1D:
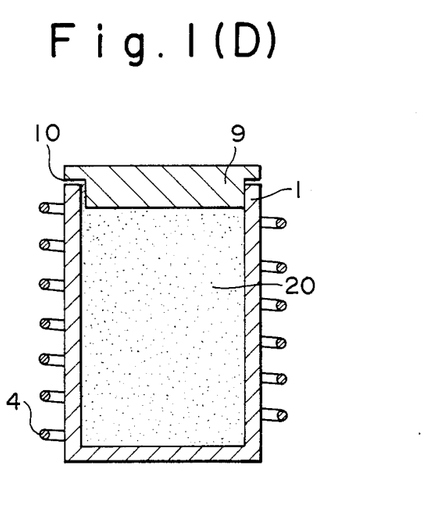

When the pressure $P_2$ of the gas generated in foamed aluminum 20 exceeds the air pressure $P_3$ in the internal space 8 of the mold 1, bubbles in foamed aluminum 20 expand, whereby air in the space 8 is released through the release port 10. When foamed aluminum 20 continues expanding to fill up the closed mold 1, the release port 10 is closed by molten aluminum 20, as shown in FIG. 1(D), and the mold is hermetically sealed. As a result, the bubbles not yet grown large due to insufficient liberation of the gas in the foaming agent retains the pressure $P_2$ to form a homogeneous cellular structure of balanced cell shape and size. Namely, though the bubbles near the free surface expand to be larger than the bubbles at other part if the mold 1 is not hermetically sealed, the above-mentioned hermetical sealing of the mold 1 ensures that the expansion of the bubbles near the free surface is obstructed by the pressure of the other bubbles so that the bubbles become substantially uniform in size.

In FIG. 4, at point $A_1$ the foaming agent is mixed and stirring is started. From the time point $A_2$ when the preheated lid 9 is fitted to close the mold 1, the internal pressure $P_2$ of the bubbles increases and, after the time point B when foamed aluminum 20 fills up the mold 1, the internal pressure increases to $P_C$ under a constant volume $V_I$ of foamed aluminum, resulting in a uniform aggregate of bubbles. At this time point (corresponding to point $a_3$ in FIG. 3) the mold is taken out of a furnace and is cooled to normal temperature, whereby homogeneous foamed aluminum 24 is obtained with cells 23 of approximately equal size as shown in FIG. 5.

Figure 6A:
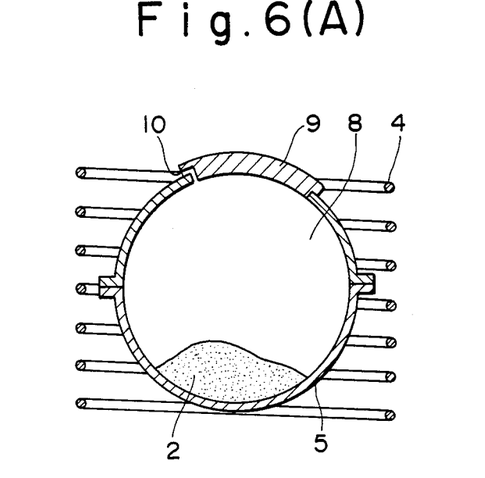
FIGS. 6(A) and 6(B) illustrate spherical molds usable according to this invention.
Figure 6B:
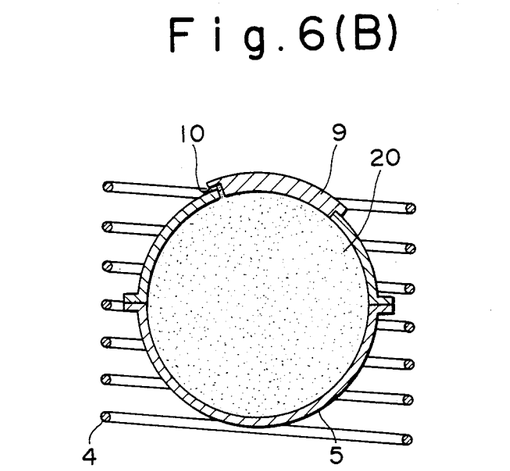

Various modifications can be made of the shape of the mold used in the above-mentioned method; for instance, spherical molds 5 as shown in FIGS. 6(A) and 6(B) may be used. In the figures, FIG. 6(A) illustrates the condition wherein a spherical mold is charged with molten aluminum 2, and FIG. 6(B) shows the condition wherein molten aluminum 20 has filled up the mold 5 to hermetically seal the release port 10.

EXAMPLE III

This example shows the use of foamed aluminum produced according to this invention as a sound absorbing material. Though a sound absorbing effect is obtained by cutting a foamed metal into a plate form to expose the rugged surfaces of foam, a higher sound absorbing effect can be obtained by forming through-holes in cell walls by drilling or compression to form a gas-permeable foamed metal.

Figure 8:
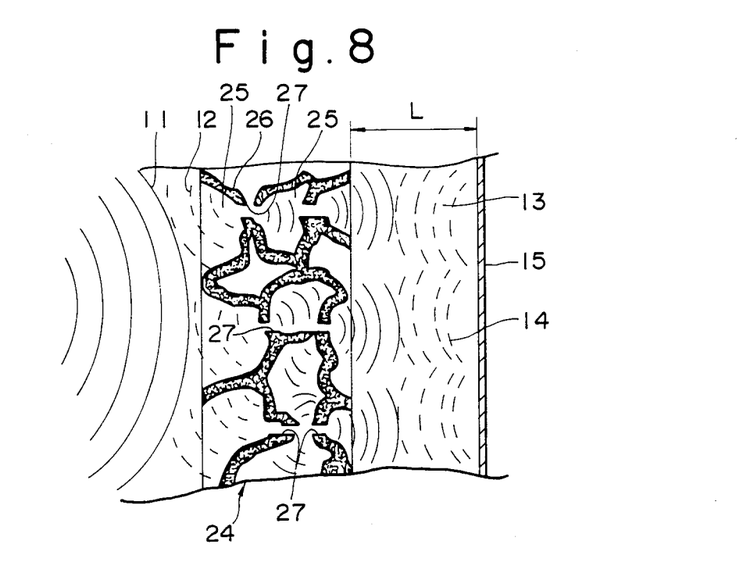
FIG. 8 illustrate a mechanism of sound absorption.
Figure 9A:
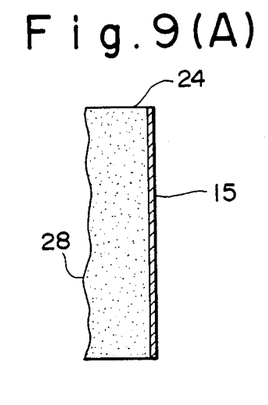
FIG. 9(A) to 9(D) illustrate examples of fitting of a foamed metal sound absorbing plate.

FIG. 8 illustrates the mechanism of sound absorption. In FIG. 8, a foamed aluminum sound absorbing plate 24 provided with through-holes 27 is connected with a sound insulating plate 15, with an air layer 13 having a thickness L therebetween. Sound waves 11 are irregularly reflected by the cell walls 26 to be reflected waves 12, which are attenuated through interference. On the other hand, sound waves passed through the holes 27 are damped by the spring action of air in the cells 25, and in the air layer, the sound waves are attenuated thorough interference with reflected waves 14 from the sound insulating plate 15. FIGS. 9(A) to 9(D) illustrate examples of fitting of the foamed metal sound absorbing plate 24, in which FIG. 9(A) shows a sound absorbing plate devoid of through-holes, FIG. 9(B) a sound absorbing plate having through-holes, FIG. 9(C) shows the case of using a plurality of sound absorbing plates, and FIG. 9(D) the case wherein a sound absorbing plate is applied to a cylindrical silencer.

Figure 10A:
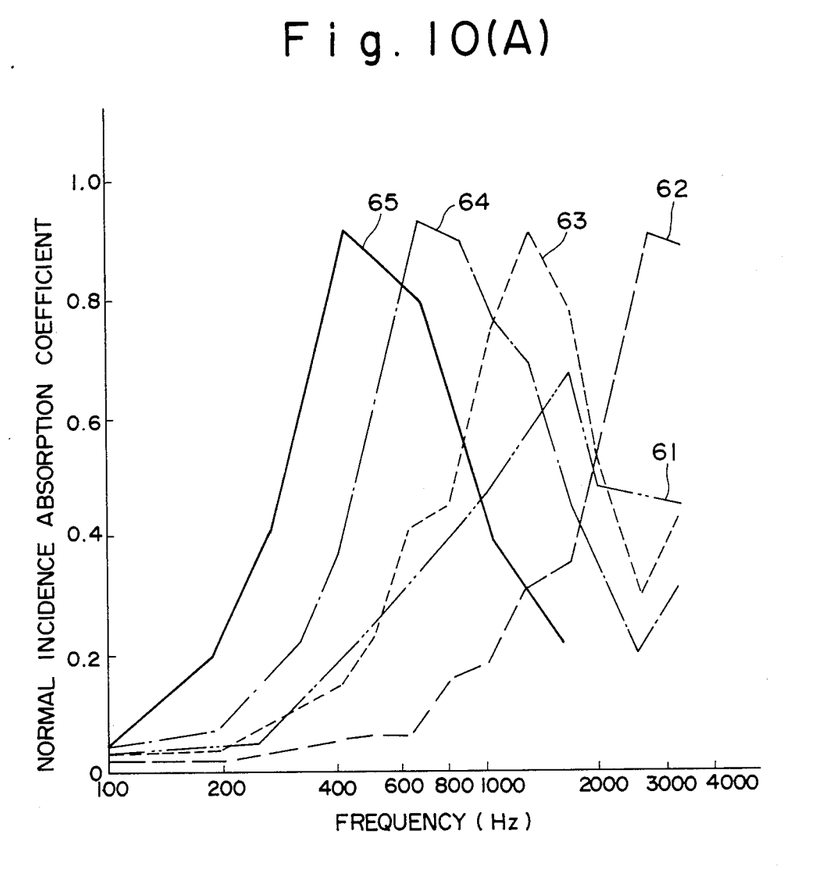
FIGS. 10(A) and 10(B) show the measurement results of sound absorption percentage of foamed luminum sound absorbing plates.
Figure 10B:
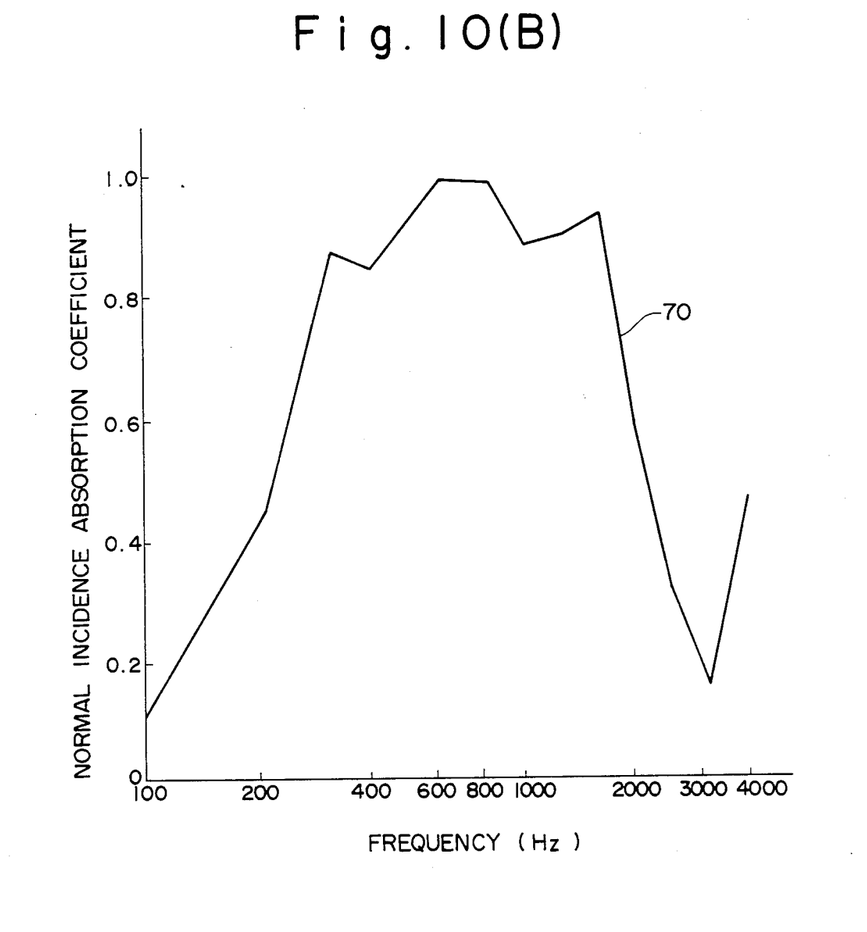

FIG. 10 shows the measurement results of sound absorption percentage of a foamed aluminum sound absorbing plate 24 having an apparent specific gravity of 0.2 and a thickness of 10 mm, with the thickness L of the air layer 11 varied. FIG. 10(A) shows the case of using a single sound absorbing plate, and FIG. 10(B) shows the case of using two sound absorbing plates 24, the results being summarized in Table 1 below.

TABLE 1

Figure 9B:
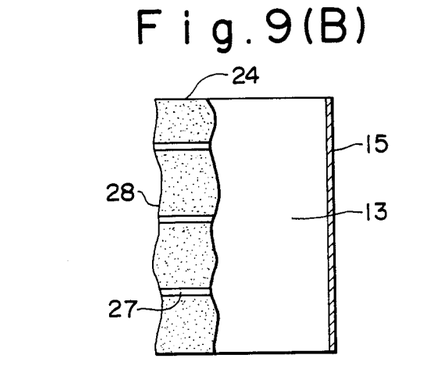
Figure 9C:
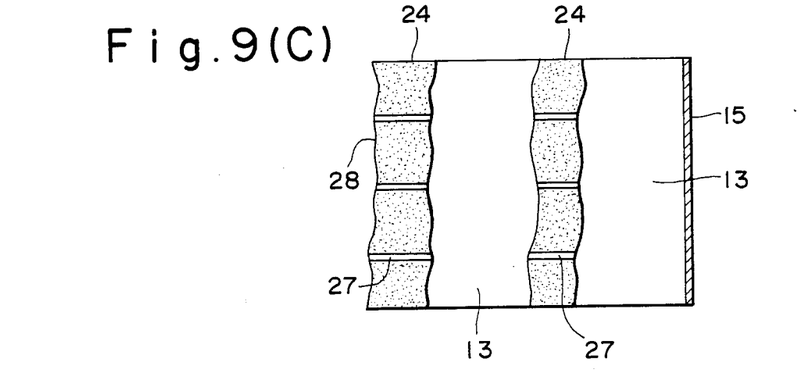
Figure 9D:
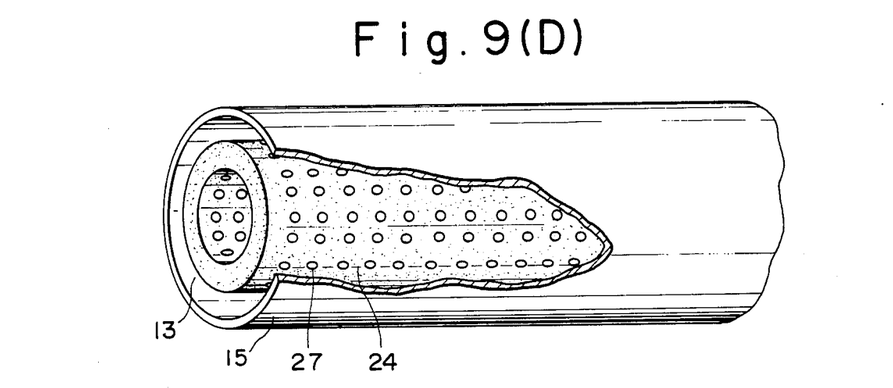

| Specimen | I | II | III | Structure |
| --- | --- | --- | --- | --- |
| Line 61 | absent | 1 | 0 | FIG. 9(A) |
| Line 62 | present | 1 | 0 | FIG. 9(A) |
| Line 63 | present | 1 | 20 | FIG. 9(B) |
| Line 64 | present | 1 | 40 | FIG. 9(B) |
| Line 65 | present | 1 | 60 | FIG. 9(B) |
| Line 70 | present | 2 | 20 | FIG. 9(C) |

Notes
I: presence or absence of through-holes in foamed aluminum
II: number of foamed aluminum
III: thickness of air layer (mm)

As seen in FIG. 10(A), the peak of sound adsorption percentage is shifted to the low frequency side as the tihckness L of the air layer is increased, and as seen In FIG. 10(B) the use of two sound absorbing plates 24 provides a higher sound absorbing effect over a wider frequency range.

In general, porous materials such as glass wool are used as sound absorbing material. However, glass wool is water-absorbent with the result of lowering in sound absorption percentage, and fibers may be broken and scattered by vibration or the like. As contrasted to such porous material, the foamed aluminum sound absorbing plate of this invention is structurally stronger, free of water-absorbent property, and provides a higher sound absorbing effect in low frequency range.

EXAMPLE IV

This example shows the case of using foamed aluminum produced according to this invention as an electromagnetic shielding material.

Figure 11A:
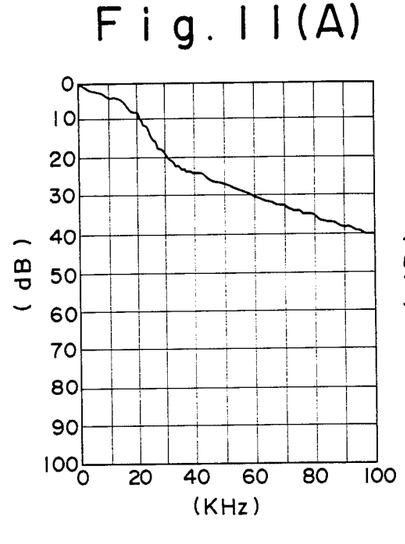
FIGS. 11(A) to 11(D) show the measurement results of electromagnetic shielding characteristics in terms of wave transmission loss versus frequency.
Figure 11B:
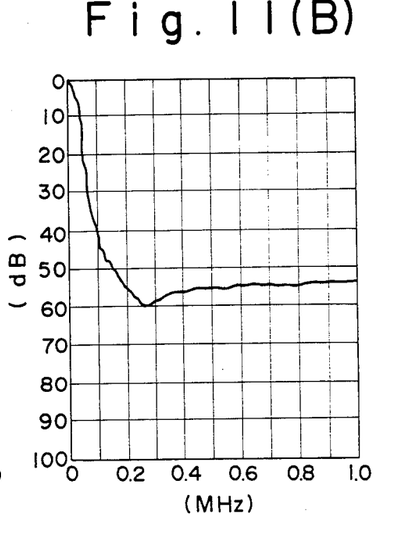
Figure 11C:
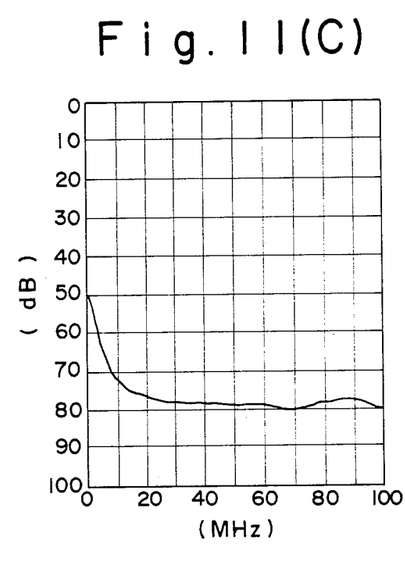
Figure 11D:
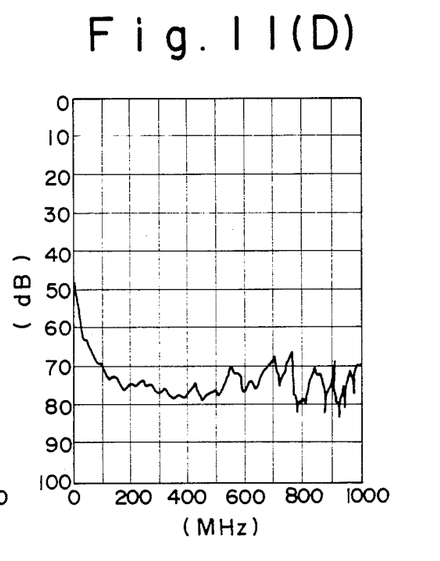

Foamed aluminum was cut into a plate form 5 mm thick, and the plates are tested for electromagnetic shielding characteristics to determine wave transmission loss versus frequency, the results being shown in FIGS. 11(A) to 11(D). FIG. 11(A) shows wave transmission loss in a frequency region of from 0 to 100 KHz, FIG. 11(B) in a region of from 0 to 1 MHz, FIG. 11(C) in a region of from 0 to 100 MHz, and FIG. 11(D) in a region of from 0 to 1000 MHz, respectively. Each of the specimens used had many through-holes not larger than 1 mm in diameter and some through-holes not larger than 5 mm in diameter. The electromagnetic shielding effect obtained was not less than 30 dB in a frequency region of above 60 KHz and, particularly, about 80 dB in a region of above 20 MHz, as shown in the figures. This performance is comparable to that of an aluminum plate of from 1 to 2 mm in thickness, and the electomagnetic shielding material is said to have a satisfactory shielding effect.

Figure 12A:
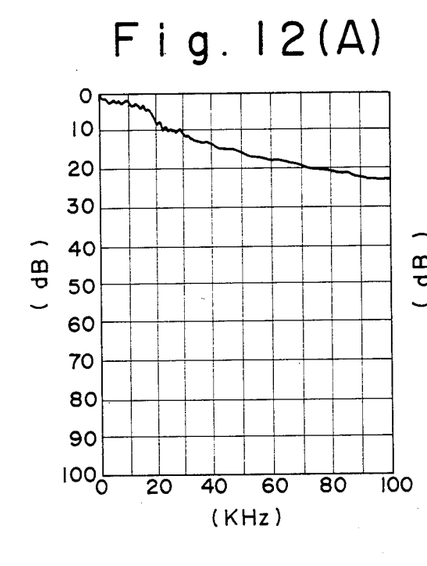
FIGS. 12(A) to 12(D) show the measurement results of electromagnetic shiedling characteristics of an electromagnetic shielding material of this invention, comprising a plurality of through holes larger than 5 mm in diameter.
Figure 12B:
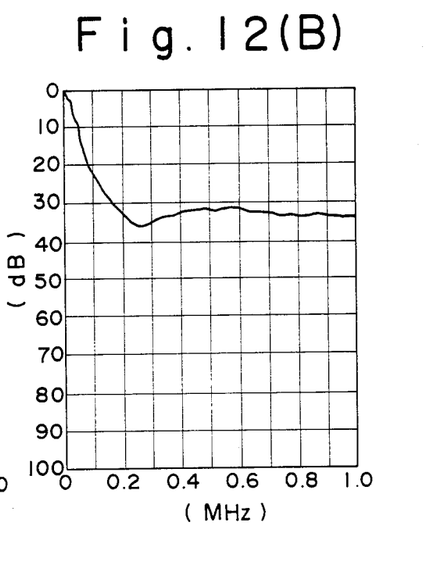
Figure 12C:
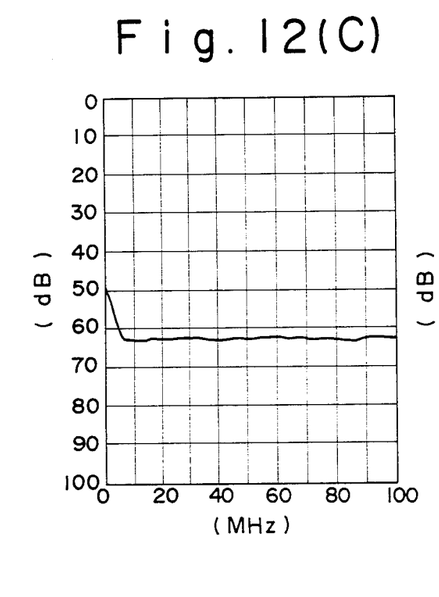
Figure 12D:
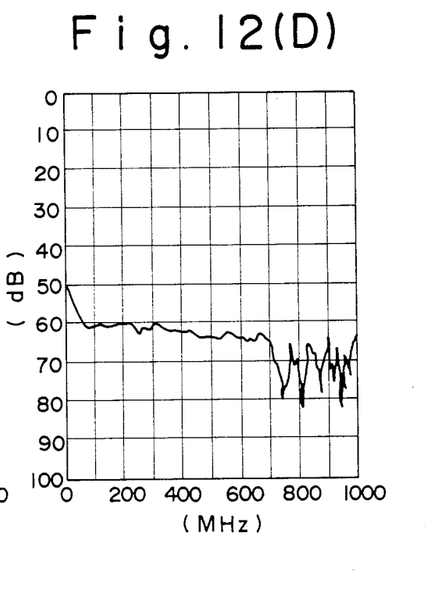

FIGS. 12(A) to 12(D) show the measurement results of electromagnetic shielding characteristics of electromagnetic shielding materials according to this invention which have a multiplicity of through-holes exceeding 5 mm in diameter. FIG. 12(A) shows the wave transmission loss (dB) in a frequency region of from 0 to 100 KHz, FIG. 12(B) in a region of from 0 to 1 MHz, FIG. 12(C) in a region of from 0 to 100 MHz, and FIG. 12(D) in a region of from 0 to 1000 MHz. Although a high shielding effect of about 60 dB is obtained in high frequency region, the shielding characteristic is lowered in a lower frequency region. Namely, where through-holes are provided, the shielding effect is insufficient if the hole diameter is 5 mm or larger, but when the diameter is not larger than 5 mm, a high electromagnetic shielding effect can be obtained over a wide range of frequency.

EXAMPLE V

This example illustrates a lightweight composite plate based on the faomed metal according to this invention.

Figure 13A:
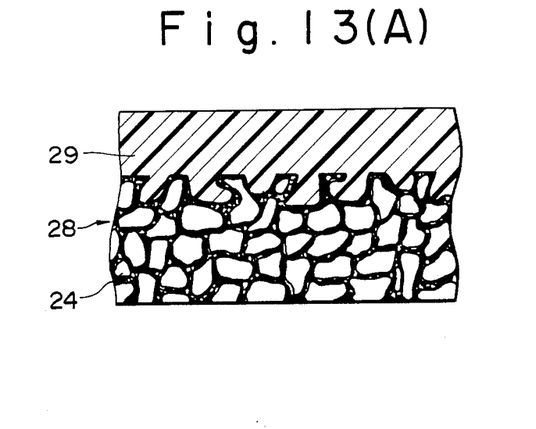
FIGS. 13(A) to 13(C) illustrate lightweight composite plates utilizing a foamed metal according to this invention.

In FIG. 13(A), a composite plate 28 comprises a foamed metal layer 24 laminated with a synthetic resin layer 29, with the resin eating into rugged part of the foamed metal to join the layers 24 to 29 to each other. The foamed metal may be aluminum, zinc, lead, copper, bronze or the like.

To produce the composite plate 28, a foamed metal is cut into a plate form to form a foamed metal layer 24, which is placed in a mold (not shown), and a liquid synthetic resin is poured into the mold form above the layer 24. As a result, the resin flows into the rugged parts of the surface of the foamed metal to form a synthetic resin layer 29 and, at the joint part, the resin eats into the rugged parts of the surface of the foamed metal to firmly join the resin and the metal. Therefore, since the layers are joined to each other by mechanical eating-in, there is no need for adhesives, neither special devices for applying an adhesive nor cure time for drying and solidification of the adhesive is required. Therefore, the joining process is simple, there is no possibility of delamination with time, and the composite plate has excellent durability. After producing the composite plate, an appropriate pattern or the like may be provided on the surface of the synthetic resin layer by printing or other means.

In the above-mentioned production process, the step of pouring a liquid synthetic resin onto the foamed metal layer in the mold may be replaced by the steps of uniformly scattering expandable polystyrene beads on the foamed metal layer and heating the beads to expand them to form a foamed synthetic resin layer. The foamed resin layer also eats into the rugged parts of the surface of the foamed metal layer at the time of expansion to results in a firm joint. An alternative method for producing the composite plate may be employed in which either one or both of the synthetic resin and the foamed metal are heated to the softening point of the resin, and pressure is applied to them in the width direction to achieve lamination.

Figure 13B:
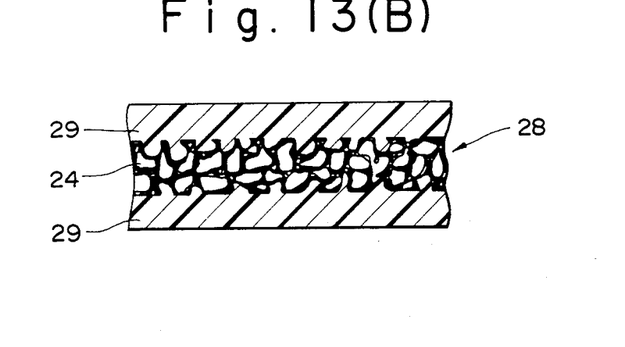

FIG. 13(B) shows another embodiment of this invention, in which synthetic resin layers 29 are provided respectively on both sides of a foamed metal layer 24. Further, in the example shown in FIG. 13(C), foamed metal layers 24 are laminated respectively on both sides of a synthetic resin layer 29. Also in these composite plates, firm joint between the layers is achieved by eating-in of the synthetic resin into the rugged parts of the surface of the foamed metal layer, in the manner mentioned above.

Figure 13C:
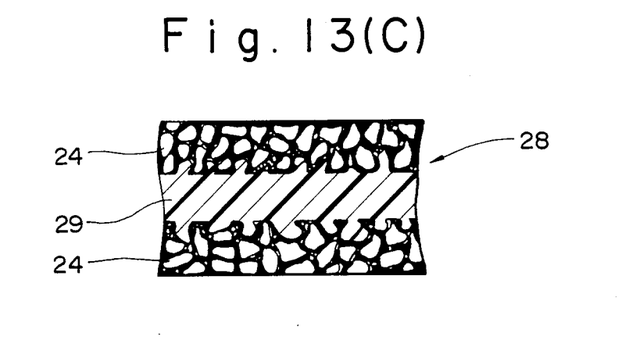

The thickness of the composite plate in any of FIGS. 13(A), 13(B) and 13(C) may be determined depending on the use of the composite plate, and is not particularly limited. For instance, the thickness of the foamed metal layer may be set to be from 15 to 100 mm, and the thickness of the synthetic resin layer may be set to be from 0.05 to 50 mm.

The plain shape. and size of the composite plate may be set in the production step according to the use, or the composite plate produced is cut to predetermined size for use. The composite plate thus obtained can be used as a walling material, furniture or other constructional plate material. In any of these uses, the composite plate of this invention is excellent in view of lightweightness, flame retardancy, strength, cost and the like.

As has been described above, Example V consists in a laminate of a foamed metal layer and a synthetic resin layer firmly joined mechanically, and since the main body is formed of a foamed metal, the composite laminate is extremely lightweight and has excellent flame retardancy and durability. In addition, according to this example, a plate material having a certain degree of strength can be produced at low cost, which displays superior function when applied to constructional plate material or the like.

What is claimed is:

1. A method of producing a foamed metal having an apparent specific gravity of from 0.2 to 0.8 and comprising an aggregate of uniform size and uniformly dispersed of polygonal closed cells having an average diameter of from 2 to 10 mm, which comprises adding in a mold a foaming agent and a thickener to a molten metal and agitating the melt, said molten metal being aluminum or an alloy thereof, said thickener being elemental calcium and said foaming agent being titanium hydride, wherein said thickener is added to said molten metal in an amount of from 0.2 to 8% by weight, the melt is agitated to adjust the viscosity of said melt, then powdered titanium hydride is added to the melt in an amount of from 1 to 3% by weight, and the melt is agitated to effect foaming, wherein before said addition of said thickener the entire body of a mold is heated to a temperature not lower than the melting point of said metal to be foamed, thereafter in the process of growth of the foam the mold is closed in the condition in which an air release port is provided, air inside said mold is released to the exterior by expansion of a multiplicity of bubbles generated on thermal decomposition of the foaming agent, said molten metal is permitted to fill up the interior of said mold to close said release port thereby hermetically sealing said mold, the internal pressure of said bubbles in said hermetically sealed mold is increased to form a uniform cellular structure under the balanced internal pressures of said bubbles, the heating of said mold is stopped to cool and solidify said foamed metal.

2. A sound absorbing plate consisting of an open cell foamed metal produced by providing through-holes in cell walls of a foamed metal having an apparent specific gravity of from 0.2 to 0.8 and comprising an aggregate of uniform size and uniformly dispersed of polygonal closed cells having an average diameter of from 2 to 10 mm so as to communicate both sides of said foamed metal plate to each other.

3. An electromagnetic shielding material consisting of a foamed metal plate having an apparent specific gravity of from 0.2 to 0.8 and comprising an aggregate of uniform size and uniformly dispersed of polygonal closed cells having an average diameter of from 2 to 10 mm, provided with through-holes, wherein the diameter of the through-holes communicating both sides of said plate to each other is not larger than 5 mm.

* * * * *

UNITED STATES PATENT AND TRADEMARK OFFICE
CERTIFICATE OF CORRECTION

PATENT NO. : 4,713,277

DATED : December 15, 1987

INVENTOR(S) : SHIGERU AKIYAMA ET AL

It is certified that error appears in the above-identified patent and that said Letters Patent is hereby corrected as shown below:

In the ABSTRACT, line 12, delete "melet" and insert --melt--.

Column 1, line 21, delete "light weight" and insert --lightweight--;

line 26, delete "haivng many funcitons" and insert --having many functions--;

line 33, delete "much" and insert --many--;

line 36, delete "decomposes" and insert --decompose--.

Column 2, line 8, delete "abovemen-" and insert --above-men- --;

line 62, delete "through-hole" and insert --through-holes--.

Column 3, line 28, delete "illustrate" and insert --illustrates--;

line 29, delete "FIG." and insert --FIGS.--;

line 30, delete "sound absorbing" and insert --sound-absorbing--;

line 32, delete "sound absorption" and insert --sound-absorption--;

UNITED STATES PATENT AND TRADEMARK OFFICE
CERTIFICATE OF CORRECTION

PATENT NO. : 4,713,277
DATED : December 15, 1987
INVENTOR(S) : SHIGERU AKIYAMA ET AL It is certified that error appears in the above-identified patent and that said Letters Patent is hereby corrected as shown below:

delete "luminum" and insert --aluminum--;

line 33, delete "sound absorbing" and insert --sound-absorbing--;

line 38, delete "shiedling" and insert --shielding--;

line 51, delete "EXAMPLE 1" and insert --EXAMPLE I--;

line 58, delete "thermallly" and insert --thermally--.

Column 4, line 3, delete "Beside," and insert --Besides,--.

Column 5, line 14, delete "$V_1$" and insert --Ve--.

Column 6, line 1, delete "retains" and insert --retain--;

line 5, between "at other" insert --the--;

line 52, delete "thorough" and insert --through--.

Column 7, line 13, delete "adsorption" and insert --absorption--;

line 15, delete "tihckness" and insert --thickness--;

line 15, delete "In" and insert --in--;

UNITED STATES PATENT AND TRADEMARK OFFICE
CERTIFICATE OF CORRECTION

PATENT NO. : 4,713,277

DATED : December 15, 1987

INVENTOR(S) : SHIGERU AKIYAMA ET AL

It is certified that error appears in the above-identified patent and that said Letters Patent is hereby corrected as shown below:

line 34, delete "are" and insert --were--.

Column 8, line 4, delete "faomed" and insert --foamed--;

line 7, after "into" insert --the--;

line 21, delete "adhesives, neither" and insert --adhesives. Neither--;

line 24, delete "simple, there" and insert --simple. There--;

line 38, delete "results" and insert --result--;

line 61, after "shape" delete --.--.

Column 9, line 1, after "consists" insert --of--.

Signed and Sealed this

Thirtieth Day of August, 1988

Attest:

DONALD J. QUIGG

Attesting Officer

Commissioner of Patents and Trademarks